US007955586B2

United States Patent
Jung et al.

(10) Patent No.: US 7,955,586 B2
(45) Date of Patent: Jun. 7, 2011

(54) SYNTHESIS OF I-III-V12 NANOPARTICLES AND FABRICATION OF POLYCRYSTALLINE ABSORBER LAYERS

(75) Inventors: Duk-Young Jung, Seongnam-si (KR); Jae Eok Han, Pyeongtaek-si (KR); Juyeon Chang, Seoul (KR)

(73) Assignee: Sungkyunkwan University Foundation For Corporate Collaboration, Gyeonggi-do (KR)

( * ) Notice: Subject to any disclaimer, the term of this patent is extended or adjusted under 35 U.S.C. 154(b) by 0 days.

(21) Appl. No.: 12/595,330

(22) PCT Filed: Jun. 17, 2008

(86) PCT No.: PCT/KR2008/003421
§ 371 (c)(1),
(2), (4) Date: Oct. 9, 2009

(87) PCT Pub. No.: WO2009/064056
PCT Pub. Date: May 22, 2009

(65) Prior Publication Data
US 2010/0120192 A1    May 13, 2010

(30) Foreign Application Priority Data

Nov. 14, 2007  (KR) .................. 10-2007-0116189
Jun. 12, 2008  (KR) .................. 10-2008-0055227

(51) Int. Cl.
*C01B 17/00*   (2006.01)
*C01B 19/00*   (2006.01)

(52) U.S. Cl. ........ 423/508; 423/511; 977/773; 977/813; 427/74; 427/76; 427/191; 427/217

(58) Field of Classification Search .................. 423/508, 423/511; 977/773, 813; 427/74, 76, 191, 427/217
See application file for complete search history.

(56) References Cited

U.S. PATENT DOCUMENTS

| | | | | |
|---|---|---|---|---|
| 6,268,014 | B1 * | 7/2001 | Eberspacher et al. | 427/74 |
| 2008/0112878 | A1 * | 5/2008 | Kardokus et al. | 423/509 |
| 2008/0213467 | A1 * | 9/2008 | Yu et al. | 427/74 |

FOREIGN PATENT DOCUMENTS

| | | |
|---|---|---|
| JP | 2003001096 A | 1/2003 |
| KR | 100588604 B1 | 6/2006 |

OTHER PUBLICATIONS

Eberspacher, Chris et al.: Thin-film CIS alloy PV materials fabricated using non-vacuum, particles-based techniques, thin solid Films, May 29, 2001, vol. 387, pp. 18-22.
International Search Report of Counterpart Application No. PCT/KR2008/003421 filed on Jun. 17, 2008.

* cited by examiner

*Primary Examiner* — Timothy C Vanoy
(74) *Attorney, Agent, or Firm* — Brian R. Morrison; Westmanm Champlin & Kelly, P.A.

(57) ABSTRACT

A method for preparing $III-VI_2$ nanoparticles and a thin film of polycrystalline light absorber layers. The method for preparing $I-III-VI_2$ nanoparticles comprises the steps of: (a1) preparing a mixed solution by mixing each element from groups I, III and VI in the periodic table with a solvent; (a2) sonicating the mixed solution; (a3) separating the solvent from the sonicated mixed solution; and (a4) drying the product resulted from the above step (a3) to obtain nanoparticles.

19 Claims, 17 Drawing Sheets

SYNTHESIS OF I-III-VI2 NANOPARTICLES AND FABRICATION OF POLYCRYSTALLINE ABSORBER LAYERS

CROSS-REFERENCE TO RELATED APPLICATION

This application is the national phase of International Patent Application No. PCT/KR2008/003421, filed on Jun. 17, 2008, and entitled "Synthesis Of I-III-VI2 Nanoparticles And Fabrication Of Polycrystalline Absorber Layers"; which claims priority to Korean Patent Application No. 10-2007-0116189, filed on Nov. 14, 2007 and to Korean Patent Application No. 10-2008-0055227, filed on Jun. 12, 2008; the disclosures of which are incorporated by reference in their entireties.

TECHNICAL FIELD

The present invention relates to a method for preparing I-III-VI$_2$ nanoparticles and a thin film of polycrystalline light absorber layers. Specifically, it relates to a method for synthesizing a compound semiconductor, I-III-VI$_2$ nanoparticles, and a method for fabricating a thin film of polycrystalline light absorber layers for solar cell by using the same.

BACKGROUND ART

I-II-VI$_2$ group chalcopyrite compound semiconductors, which can be represented by CuInSe$_2$, have a direct transition energy band gap, very high light absorption which makes it possible to produce highly efficient solar cells in the form of a thin film having a thickness of several micrometers, and excellent electrical and optical stability, thereby being very ideal for a light absorber material of solar cells. Specifically, Cu(In,Ga)Se$_2$ solar cells have been emerging as those being capable of replacing the conventional expensive crystalline silicon solar cells, owing to their highest energy efficiency (NREL, >19%) among thin film solar cells, and high price competitiveness as compared to conventional silicon-based solar cells. However, multinary compounds such as chalcopyrite compounds require very complex manufacturing processes. Therefore, there are still needs for constant reduction of production cost through process improvement in solar cells based on chalcopyrite compounds in order to compete with fossil fuel.

Since CuInSe$_2$ compounds have 1.04 eV of an energy band gap just right below the band gap (1.4 eV) ideal for a solar cell, solar cells based on them have relatively high short-circuit current ($J_{sc}$), but relatively low open-circuit voltage ($V_{oc}$). For raising the open-circuit voltage, a part of indium (In) is often substituted by gallium (Ga), or a part of selenium (Se) with sulfur (S). These are, depending on the components, expressed as follows: CuInSe$_2$ (CIS), CuGaSe$_2$ (CGS), Cu(In,Ga)Se$_2$ (CIGS), CuInS$_2$, CuGaS$_2$, Cu(In,Ga)S$_2$, CuIn(Se,S)$_2$ (CISS), CuGa(Se,S)$_2$ (CGSS) and Cu(In,Ga)(Se,S)$_2$ (CIGSS), and these compounds are collectively referred as CIS solar cells. CIS solar cells are generally formed by sequentially applying 5 layers of thin film units—a back-contact electrode, a light absorber layer, a buffering layer, a front transparent electrode and an anti-reflective coat on a substrate, which is generally glass. For each thin film unit, various species and compositions, and for manufacturing methods, various kinds of physical or chemical thin film manufacturing processes can be used.

The light absorber layers in CIS solar cells are typically fabricated by physical evaporation methods using vacuum techniques such as co-evaporation, sputtering and the like. The co-evaporation, a technique of fabricating a thin film by feeding each element such as Cu, In, Ga and Se into a small electric furnace installed in a vacuum chamber, and heating them for vacuum evaporation on a substrate, was taken by a National Renewable Energy Laboratory (NREL) in US, resulting in CIGS solar cells having 19.5% energy conversion efficiency. However, this method requires great investment at early stage and is difficult to expand the scale since it uses a high vacuum technique. Further, serious contamination inside the vacuum equipment makes it hard to fabricate a thin film in continuous and reproducible way. Sputtering is a method widely used in this field since it requires a rather simple set-up and can easily evaporate metal or insulating materials. For example, Shell Solar Company manufactures a CIGS thin film by sequentially sputtering a copper-gallium alloy target and an indium target so as to fabricate a thin film of Cu—Ga—In alloy and treating it with heat in H$_2$Se gas atmosphere. This method is advantageous in that manufacture is relatively easier than that using co-evaporation, but still requires great investment at early stage and also has limit on expanding the scale since it is also based on a vacuum technique.

Co-evaporation and sputtering make it relatively hard to produce large-area solar cells, and are one of main causes for lowering the price competitiveness of solar cells owing to the high production cost. In order to find alternative methods to such problems, researches on nanoparticle processes are being currently made, wherein light absorber layers are manufactured by depositing nanoparticles onto a substrate through a methods such as spraying, screen printing, inkjet printing, doctorblade, spin casting and the like, other than physical vapor deposition using vacuum technology, and treating the resulted substrate with heat. FIG. 1 is a view schematically illustrating a method for fabricating a light absorber layer by using a nanoparticle process. According to the nanoparticle process, a thin film of light absorber layers is formed by coating nanoparticles (101) manufactured as disclosed in FIG. 1 on a substrate (103) and heating the nanoparticles to form a polycrystalline thin film (102).

For manufacturing the light absorber layer for a solar cell by using a nanoprocess, synthesis of nanoparticle precursors comprising the corresponding elements should be carried out first. The precursors are largely classified by nanoparticle oxides of binary or ternary compounds such as CIS, CIGS nanoparticles, Cu—In—O, Cu—In—Ga—O and the like.

U.S. Pat. No. 6,268,014 reports a technique which comprises: synthesizing an oxide of a ternary compound (e.g. Cu$_2$In$_{1.5}$G$_{0.5}$O$_5$, Cu$_2$In$_2$O$_5$ Cu$_2$O—In$_2$O$_3$) in less than micrometer scale by an ultrasonic nebulizer; forming the resulted product as a solution or paste to form a thin film; heat-treating the thin film in a reducing atmosphere, resulting in a CIS thin film. This method has a problem such that the average size of the particles are rather big as being in the range of hundreds nanometers, being unable to lower the heating process temperature. As a similar method, EP patent No. 0 978 882 A2 discloses a method of fabricating a CIS thin film which comprises: synthesizing oxides of Cu and In by precipitating Cu-hydroxide and In-hydroxide from an aqueous solution and heating them; depositing the oxides on a substrate to form a thin film; heat-treating the thin film in a reducing atmosphere. This invention also results in the particles in micrometer scale, not nanometer scale, and the heating temperature is about 550° C. Further, the invention requires an additional step of supplying selenium after removing oxygen from the oxides, since it employs oxides as a precursor.

U.S. Pat. No. 6,126,740 reports that it is possible to obtain CIGS thin film by reacting CuI, InI$_3$ and GaI$_3$ dissolved in pyridine with Na$_2$Se dissolved in methanol at a low temperature to obtain a CIGS colloid, then depositing the colloid onto a substrate by, for example using spray deposition, and then heating the resulted layer. However, this method has difficulties such that pretreatments for deoxidization and dehydration are required and the whole process should be performed in inert atmosphere. Yitai Quian et al. (Adv. Mater. 11(17), 1456-1459 (1999)) has reported the synthesis of CIS nanoparticles by subjecting CuCl$_2$, InCl$_3$ and Se particles in a mixed solvent of ethylenediamine and diethylamine into a solvothermal route. This method also has problems such that manufacture and separation of precursors are difficult owing to the use of a toxic strong basic solvent, amine compounds, and it requires a long reaction period of one day or more and a high reaction temperature of 180° C. or more.

TECHNICAL PROBLEM

The object of the present invention is to provide a method for conveniently manufacturing a light absorber layer for a solar cell which has a desired composition, by synthesizing I-III-VI$_2$ nanoparticle precursors having a uniform size in rather eco-friendly and simple way; depositing the precursors onto a substrate to form a thin film; and treating the thin film with heat, in order to solve the above-said problems of prior arts.

TECHNICAL SOLUTION

For achieving such technical object, the present invention provides a method for preparing I-III-VI$_2$ nanoparticles, characterized by comprising: (a1) preparing a mixed solution by mixing each element from groups I, III and VI in the periodic table with a solvent; (a2) sonicating the mixed solution; (a3) separating the solvent from the sonicated mixed solution; and (a4) drying the product resulted from the above step (a3) to obtain nanoparticles.

The present invention also provides a method for fabricating a thin film of polycrystalline light absorber layers, characterized by comprising the steps of: (S1) preparing I-III-VI$_2$ nanoparticles by using a nanoparticle preparation method according to the present invention; (S2) depositing the nanoparticles onto a substrate; and (S3) heat-treating the nanoparticles deposited on the substrate in an atmosphere of Se, S, inert gas or gas mixture thereof, obtaining a thin film of polycrystalline I-III-VI$_2$.

ADVANTAGEOUS EFFECT

According to the present invention, it is possible to easily obtain a thin film of polycrystalline light absorber layers having a desired composition by synthesizing I-III-VI$_2$ nanoparticles in uniform size using ultrasonic wave for crush and dispersion, fabricating a thin film thereof, and heating the resulted thin film. Further, it is expected to simplify conventional processes and thus significantly reduce the production cost, since conventional deoxidization processes are not required in the present invention. In addition, the present invention is expected to be largely used in industry, owing to its capability of mass production and environmental-friendliness, wherein the solvent used in the manufacturing process is chemically stable, non-hazardous to human, and capable of being reused in the manufacturing process.

NUMERALS MAINLY USED IN THE FIGURES

Figure 1:
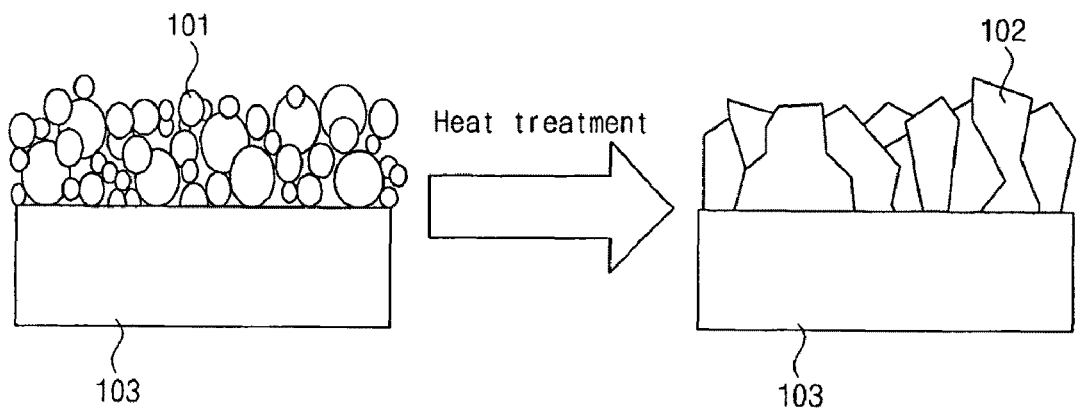
FIG. 1 is a view schematically illustrating a method of fabricating light absorber layers using a nanoparticle process.

101: CuIn$_x$Ga$_{1-x}$S$_2$ nanoparticle precursor
102: Cu(In$_x$Ga$_{1-x}$) (Se$_y$S$_{1-y}$)$_2$ polycrystal
103: substrate
201: ultrasonic generator
202: reactor              203: Ti horn
204: thermostat           205: heater

MODE FOR INVENTION

The present inventors have continuously repeated investigation to solve the conventional technical problems, and found that it is possible to produce $CuInSe_2$, $Cu(In,Ga)Se_2$, $CuGaSe_2$, $CuInS_2$, $Cu(In,Ga)S_2$, $CuGaS_2$, $CuIn(Se,S)_2$, $CuGa(Se,S)_2$ and $Cu(In,Ga)(Se,S)_2$ nanoparticles by mixing raw materials and treating the mixture with ultrasonic wave under certain conditions, and also possible to fabricate various types of polycrystalline CIS thin films in rather simple way by heating a thin film made of the above nanoparticles in an atmosphere of Se, S, inert gas or mixtures thereof, thereby completing the present invention.

Figure 2:
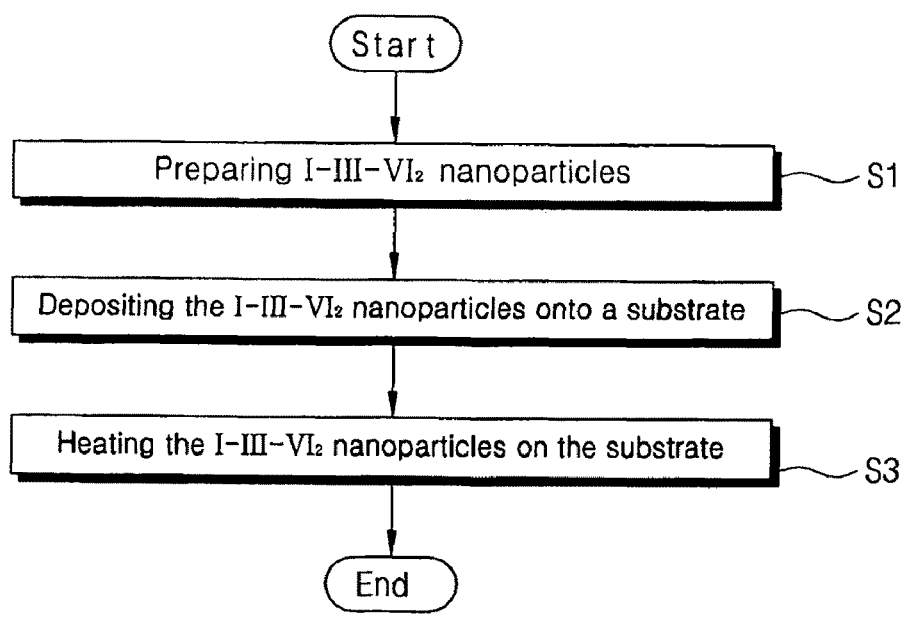
FIG. 2 is a process flow chart of a method for fabricating a thin film of polycrystalline light absorber layers according to the present invention.

The method for fabricating a thin film of polycrystalline light absorber layers as disclosed in FIG. 2 comprises the steps of: (S1) preparing I-II-$VI_2$ nanoparticles by using ultrasonic wave; (S2) depositing the nanoparticles onto a substrate; and (S3) heat-treating the nanoparticles deposited on the substrate in an atmosphere of Se, S, inert gas or gas mixture thereof, forming a thin film of polycrystalline I-III-$VI_2$.

Specifically, the step of preparing I-III-$VI_2$ nanoparticles using ultrasonic wave may be comprised of: (a1) preparing a mixed solution by mixing each element from groups I, III and VI in the periodic table with a solvent; (a2) sonicating the mixed solution; (a3) separating the solvent from the sonicated mixed solution; and (a4) drying the product resulted from the above step (a3) to obtain nanoparticles. Through the procedures, $CuInSe_2$, $CuGaSe_2$, $Cu(In,Ga)Se_2$, $CuInS_2$, $CuGaS_2$, $Cu(In,Ga)S_2$, $CuIn(Se,S)_2$, $CuGa(Se,S)_2$ and $Cu(In,Ga)(Se,S)_2$ nanoparticles can be obtained.

Solvents used in preparation of a mixed solution are water or alcoholic solvents added with N-chelants, or optionally added with ionic liquids, for improving the reaction properties.

Since alcoholic solvents and water are inactive components in a solution, they may be recycled after synthesis of nanoparticles. The high boiling point of them also makes them advantageously utilized in a high temperature reaction condition, without solvent loss. Alcoholic solvents may be used herein include, for example, dihydric, trihydric or polyhydric aliphatic alcohols such as methanol, ethanol, propanol, isopropanol, butanol, isobutanol, 3-methyl-3-methoxy butanol, tridecyl alcohol, pentanol, ethylene glycol, propylene glycol, diethylene glycol, triethylene glycol, polyethylene glycol, dipropylene glycol, hexylene glycol, butylene glycol, sucrose, sorbitol and glycerin.

The N-chelant is a nitrogen compound which functions as a complexing agent in a solution, forming complex ions with raw materials, thereby further serving to promote the reaction. As for the N-chelant, for example, dimethyl amine, triethylamine, diethylene diamine, diethylene triamine, toluene diamine, m-phenylenediamine, diphenyl methane diamine, hexamethylene diamine, triethylene tetramine, tetraethylenepentamine, hexamethylene tetramine, 4,4-diaminodiphenyl methane, hydrazine, hydrazide, thioacetamide, urea, thiourea or the like may be used. Since most of nitrogen compounds are difficult to handle and use owing to their strong alkalinity and high toxicity, it is preferred to use them at the minimum amount within the range of concentration required for synthesis of nanoparticles in a solution.

The ionic liquid is added as an auxiliary chelant, which means it is used optionally depending on the main chelant first used. When the N-chelant does not sufficiently process a reaction, the ionic liquid functions to stabilize the metal complex ions formed by the N-chelant and to promote the reaction. The ionic liquid added to the solvent may be fat-soluble or water-soluble, and comprises cations such as alkyl ammonium, N-alkyl pyridinium, N-alkyl pyridazinium, N-alkyl pyrimidinium, N-alkyl pyrazinium, N,N-alkyl imidazolium, N-alkyl pyrazolium, N-alkyl thiazolium, N-alkyl oxazolium, N-alkyl triazolium, N-alkyl phosphonium and N-alkyl pyrrolidinium or derivatives thereof, and anions such as hexafluoroantimonate ($SbF_6^-$), hexafluorophosphate ($PF6^-$), tetrafluoroborate ($BF_4^-$), bis(trifluoromethylsulfonyl)amide ($(CF_3SO_2)_2N^-$), trifluoromethanesulfonate ($CF_3SO_3^-$), acetate ($OAc^-$), or nitrate ($NO_3^-$) or the like.

In preparing I-II-$VI_2$ nanoparticles, for group I element, copper or copper compounds; for group III element, indium or indium compounds, and gallium or gallium compounds; for group VI element, selenium or selenium compounds, sulfur or sulfur compounds or the like may be used. Depending on the raw materials selected, $Cu(In_xGa_{1-x})(Se_yS_{1-y})_2$ (0<x<1, 0<y<1), $CuIn_xGa_{1-x}Se_2$ (0<x<1), $CuIn_xGa_{1-x}S_2$ (0<x<1), $CuIn(Se_yS_{1-y})_2$ (0<y<1), $CuGa(Se_yS_{1-y})_2$ (0<y<1), $CuGaSe_2$, $CuGaS_2$, $CuInSe_2$, $CuInS_2$ nanoparticles can be prepared.

As for the copper compound, CuO, $CuO_2$, CuOH, $Cu(OH)_2$, $Cu(CH_3COO)$, $Cu(CH_3COO)_2$, $CuF_2$, CuCl, $CuCl_2$, CuBr, $CuBr_2$, CuI, $Cu(ClO_4)_2$, $Cu(NO_3)_2$, $CuSO_4$, CuSe, $Cu_{2-x}Se$ (0<x<2), $Cu_2Se$ or hydrates thereof may be used; for the indium compound, $In_2O_3$, $In(OH)_3$, $In(CH_3COO)_3$, $InF_3$, InCl, $InCl_3$, $ClInBr$, $InBr_3$, InI, $InI_3$, $In(ClO_4)_3$, $In(NO_3)_3$, $In_2(SO_4)_3$, $In_2Se_3$, $InGaSe_3$ or hydrates thereof may be used; for the gallium compound, $Ga_2O_3$, $Ga(OH)_3$, $Ga(CH_3COO)_3$, $GaF_3$, GaCl, $GaCl_3$, GaBr, $GaBr_3$, GaI, $GaI_3$, $Ga(ClO_4)_3$, $Ga(NO_3)_3$, $Ga_2(SO_4)_3$, $Ga_2Se_3$, $InGaSe_3$ or hydrates thereof may be used; for the selenium compound, Se, $H_2Se$, $Na_2Se$, $K_2Se$, $Ca_2Se$, $(CH_3)_2Se$, CuSe, $Cu_{2-x}Se$ (0<x<2), $Cu_2Se$, $In_2Se_3$ or hydrates thereof may be used; and for the sulfur compound, thioacetamide, thiourea, thioacetic acid, alkyl thiol or sodium sulfide may be used.

The ultrasonicating process of the present invention is preferably carried out 1 hour or more at a temperature range of −13 to 200° C. When the temperature or reaction time is less than the said range, the reaction does not occur or by-products can be obtained together. Exceeding the upper limit of the process temperature and time is not preferred in terms of process efficiency. After ultrasonication, the solvent may be removed for recycle, and the removal of the solvent can be carried out by using a filter, centrifugation or the like.

The stoichiometric ratio of Cu, In, Se and S in the nanoparticles prepared according to the present invention can be determined by adjusting the ratio of raw materials for Cu, In, Ga, Se and S added to the synthetic reaction using ultrasonic wave. For example, for the synthesis of $CuIn_{0.7}Ga_{0.3}Se_2$ nanoparticles, raw material compounds for Cu, In, Ga and Se are preferably mixed at the molar ratio of 1:0.7:0.3:2 and added to the reaction.

The resulted nanoparticles may be formed into the shape of an ink or a paste, and then deposited onto a substrate by a technique such as spray, screen printing, inkjet printing, doctorblade, spin casting and the like. The substrate deposited with the nanoparticles can be fabricated as a thin film of polycrystalline light absorber layers by heat treatment in an atmosphere of Se, S, inert gas or gas mixture thereof. At this time, the temperature of heat treatment is preferred to be in the range of 350 to 550° C.

Hereinafter, the present invention is further illustrated with a reference of preferred examples, without limiting the scope of the present invention. However, various modifications and variations may be possibly made to the examples of the invention within the scope of the present invention.

EXAMPLES

Figure 3:
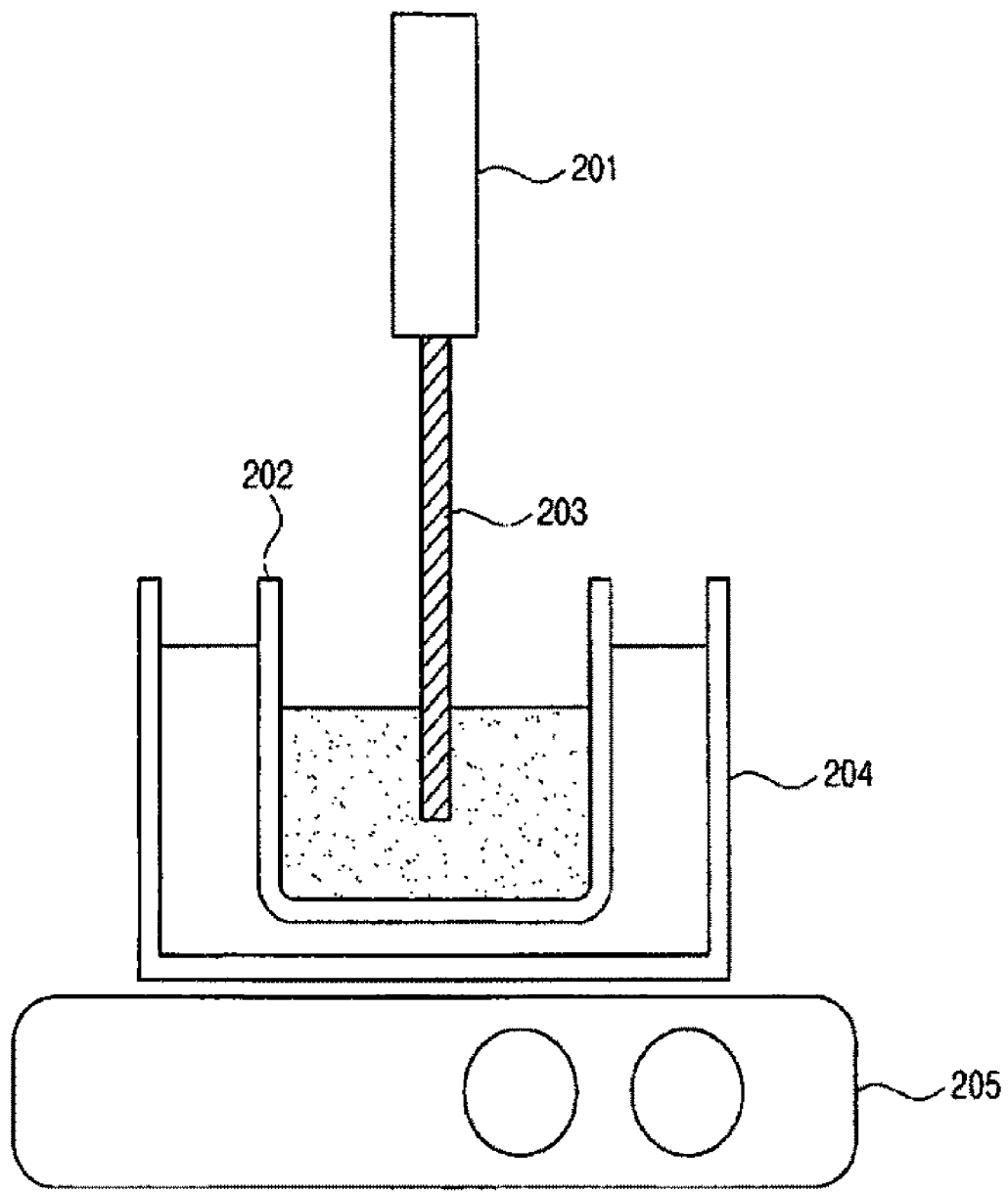
FIG. 3 is a schematic view of an ultrasonic device used in the examples of the present invention.

For producing $CuInSe_2$ nanoparticle precursors according to the present invention, a bar-shaped ultrasonic device comprised of an ultrasonic generator (201) equipped with a Ti horn (203), a reactor (202), a thermostat (204) and a heater (205) was prepared. The schematic view of the device was shown in FIG. 3.

The ultrasonic device used in the present invention is a bar-shaped ultrasonic wave generator (101), available from SONICS & MATERIALS (model No. VCX 750), of which frequency was set to 20 kHz, and output to 200 W for the reaction. A thermostat (104) was used for maintaining the temperature constantly.

Example 1

Preparation of CuInSe$_2$ Nano Particles

Cu(CH$_3$COO)$_2$, In(CH$_3$COO)$_3$ and Se powders were placed into a reactor (102) with the molar ratio of 1:1:2. The reactor was charged with triethylene tetramine, 1-butyl-3-methylimidazolinium trifluoromethanesulfonate and an alcoholic solvent. The mixture was subjected to ultrasonication for 4 hours at 100° C. and then allowed to cool in the air. The resulted product was centrifuged to remove the solvent, washed several times with distilled water and ethanol, and then dried for 4 hours at 80° C. under the atmospheric pressure.

Figure 4:
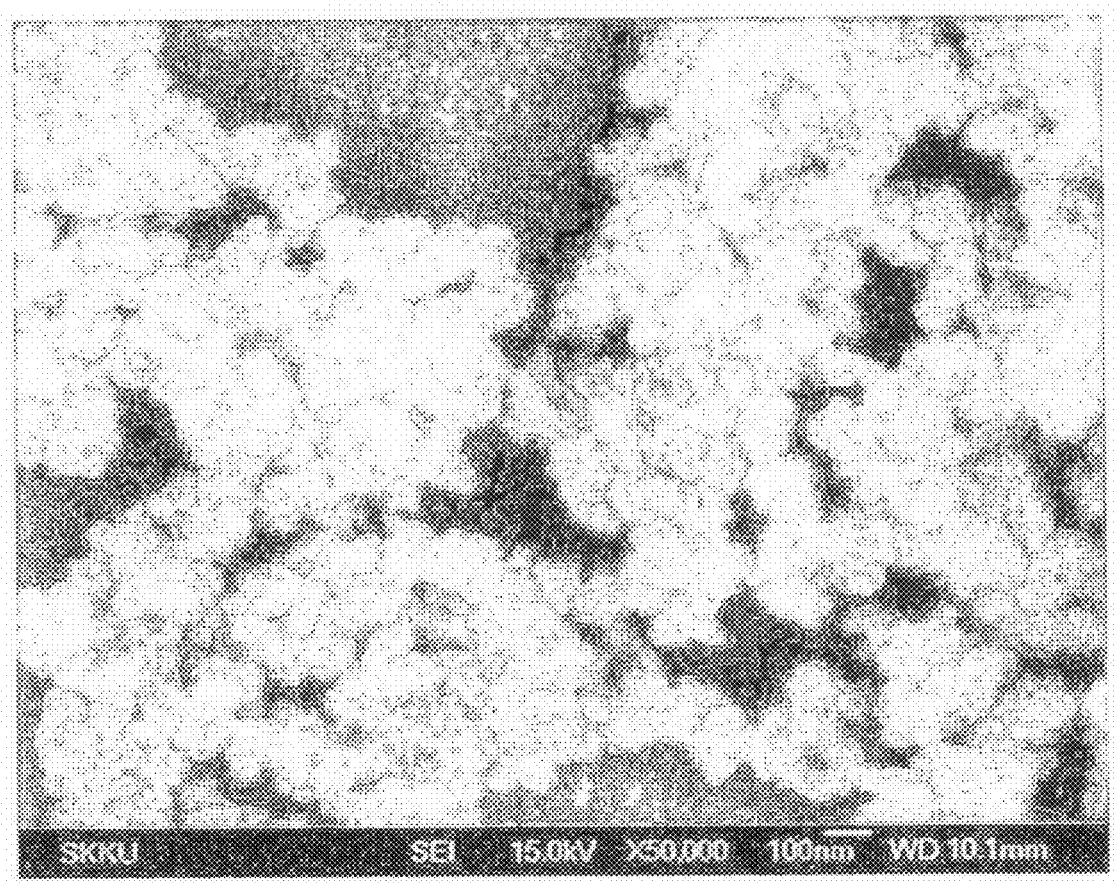
FIG. 4 is a scanning electron micrograph of CuInSe$_2$ nanoparticles prepared by Example 1.
Figure 5:
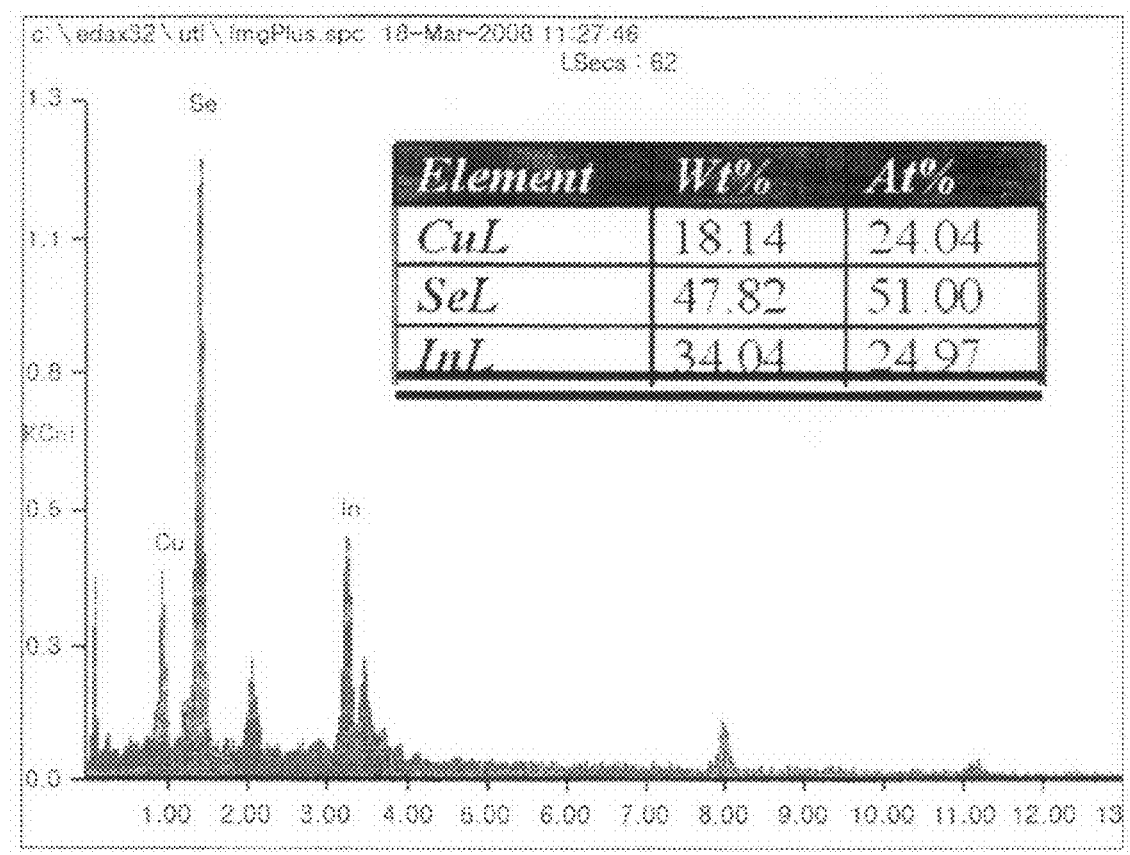
FIG. 5 is an EDS photo of CuInSe$_2$ nanoparticles prepared by Example 1.
Figure 6:
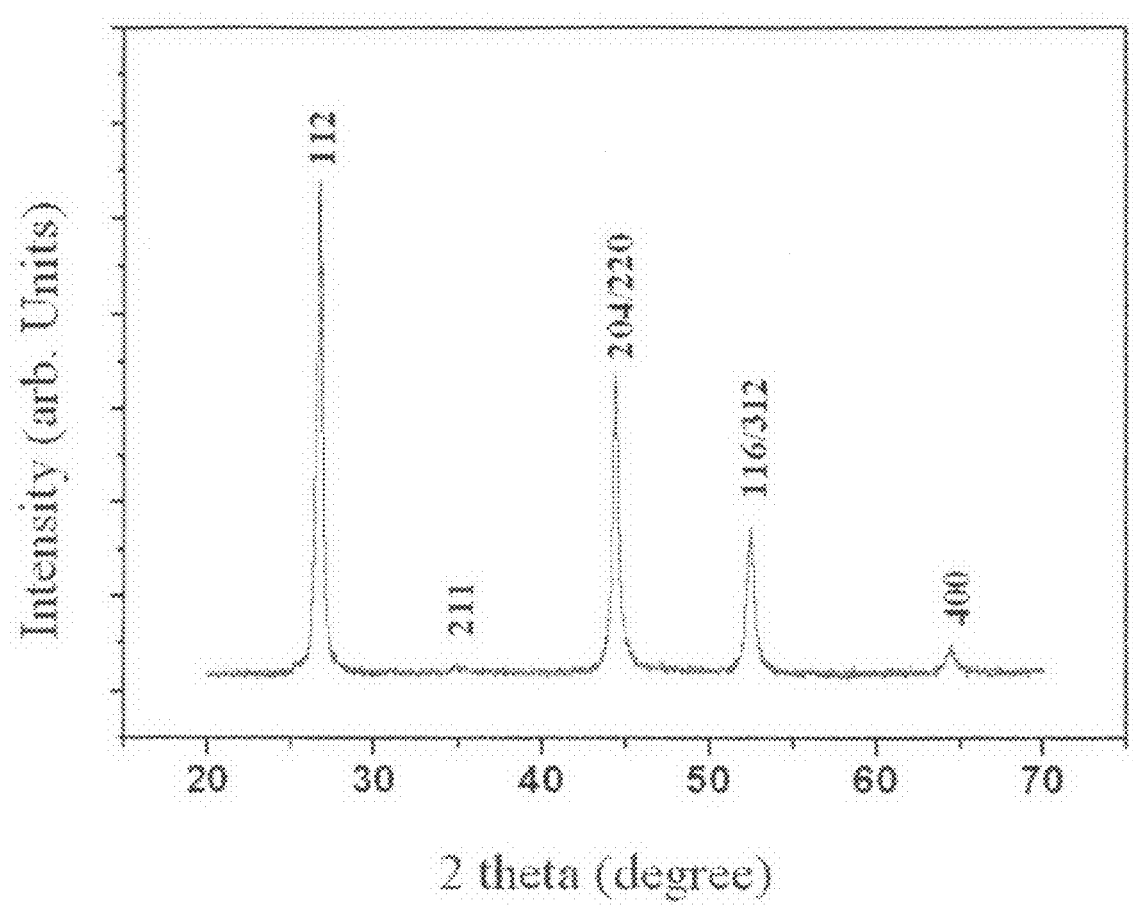
FIG. 6 is a graph of X-ray diffraction analysis of CuInSe$_2$ nanoparticles prepared by Example 1.

For qualitative analysis to find out the composition of thus obtained CuInSe$_2$ nanoparticles as well as their particle size distribution, EDS (Energy Dispersive Spectroscopy) and Scanning Electron Microscopy (SEM) were carried out, and the results thereof were disclosed in FIGS. 4 and 5. It was found that the final product had the ratio of each element of Cu:In:Se being 0.96:1.00:2.04 and was comprised of particles having a particle diameter of 100 nm~150 nm. A powder X-ray diffraction (XRD) was used to find out the phase of the resulted product, and the results were disclosed in FIG. 6. The pattern of X-ray diffraction of the resulted product corresponded to the main peaks (112), (204)/(220) and (312)/(116) of CIS in cubic phase, supporting that the obtained CIS nanoparticles have a cubic crystal structure.

Example 2

First Reuse of Solvent

By reusing the separated solvent by centrifugation in Example 1, CuInSe$_2$ nanoparticles were synthesized. First, Cu(CH$_3$COO)$_2$, In(CH$_3$COO)$_3$ and Se powders were placed into a reactor with the molar ratio of 1:1:2. The reactor was charged with the solvent obtained from Example 1. The mixture was subjected to ultrasonication and then dried in the air. The resulted product was centrifuged to remove the solvent, washed several times with distilled water and an alcohol, and dried for 4 hours at 80° C. under the atmospheric pressure. The obtained nanoparticles were subjected to powder X-ray diffraction, and the graph showing the results was illustrated in FIG. 7(a).

Example 3

Second Reuse of Solvent

By reusing the separated solvent by centrifugation in Example 2, CuInSe$_2$ nanoparticles were synthesized. Materials for Cu, In and Se were placed into a reactor. The reactor was charged with the solvent obtained from Example 3. To the resulted solution, ultrasonic waves were applied. From this point, for the subsequent steps, the same steps as in Example 2 were used to prepare nanoparticles. The graph of powder X-ray diffraction analysis of the obtained nanoparticles was illustrated in FIG. 7(b).

Example 4

Third Reuse of Solvent

By reusing the separated solvent by centrifugation in Example 3, CuInSe$_2$ nanoparticles were synthesized. Materials for Cu, In and Se were placed into a reactor. The reactor was charged with the solvent obtained from Example 3. To the resulted solution, ultrasonic waves were applied. From this point, for the subsequent steps, the same steps as in Example 2 were used to prepare nanoparticles. The graph of powder X-ray diffraction analysis of the obtained nanoparticles was illustrated in FIG. 7(c).

Example 5

Fourth Reuse of Solvent

By reusing the separated solvent by centrifugation in Example 4, CuInSe$_2$ nanoparticles were synthesized. Materials for Cu, In and Se were placed into a reactor. The reactor was charged with the solvent obtained from Example 4. To the resulted solution, ultrasonic waves were applied. From this point, for the subsequent steps, the same steps as in Example 2 were used to prepare nanoparticles. The graph of powder X-ray diffraction analysis of the obtained nanoparticles was illustrated in FIG. 7(d).

Figure 7:
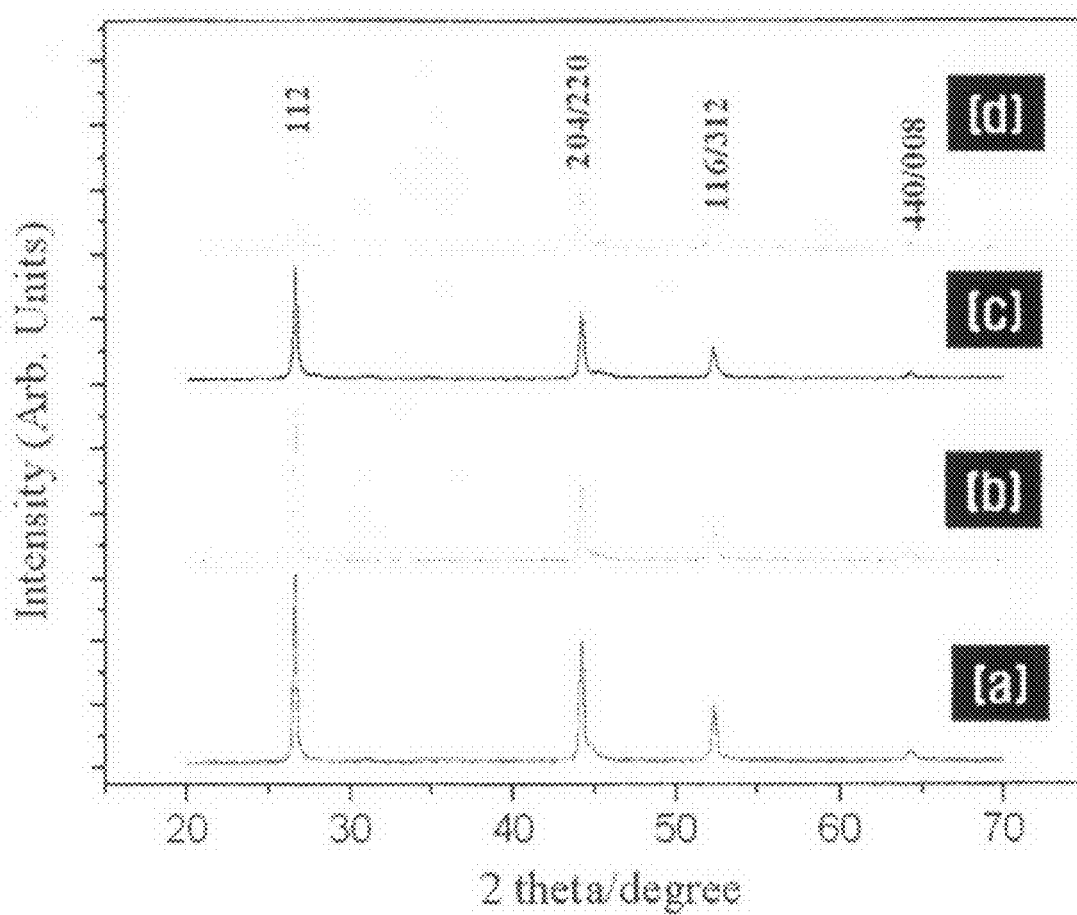
FIG. 7 is a graph of X-ray diffraction analysis of CuInSe$_2$ nanoparticles prepared by Examples 2 to 5.

FIG. 7 shows the X-ray diffraction results of each CIS nanoparticles synthesized by reusing the solvent separated from Example 1 in repeated way. From the results, peaks at 2θ=26.6 are commonly observed, which show that resulted products are commonly oriented along the (112) direction of typical cubic crystal structure of CIS. This conforms that the solvent once used in nanoparticle synthesis can be continuously reused in the nanoparticle synthesis without additional supply, suggesting that the present invention is highly economical and environmentally-friendly.

Example 6

Preparation of Cu(In,Ga)Se$_2$ Nanoparticles

CuCl, In(CH$_3$COO)$_3$, Ga(NO$_3$)$_3$ and Se powders were placed into a reactor with the molar ratio of 1:0.7:0.3:2, and mixed with an alcoholic solvent. It was subjected to ultrasonication for 4 hours at 80° C. and then allowed to cool in the air. The resulted product was centrifuged to remove the solvent, washed several times with distilled water and ethanol, removing by-products, and then dried for 4 hours at 80° C. under the atmospheric pressure.

Figure 8:
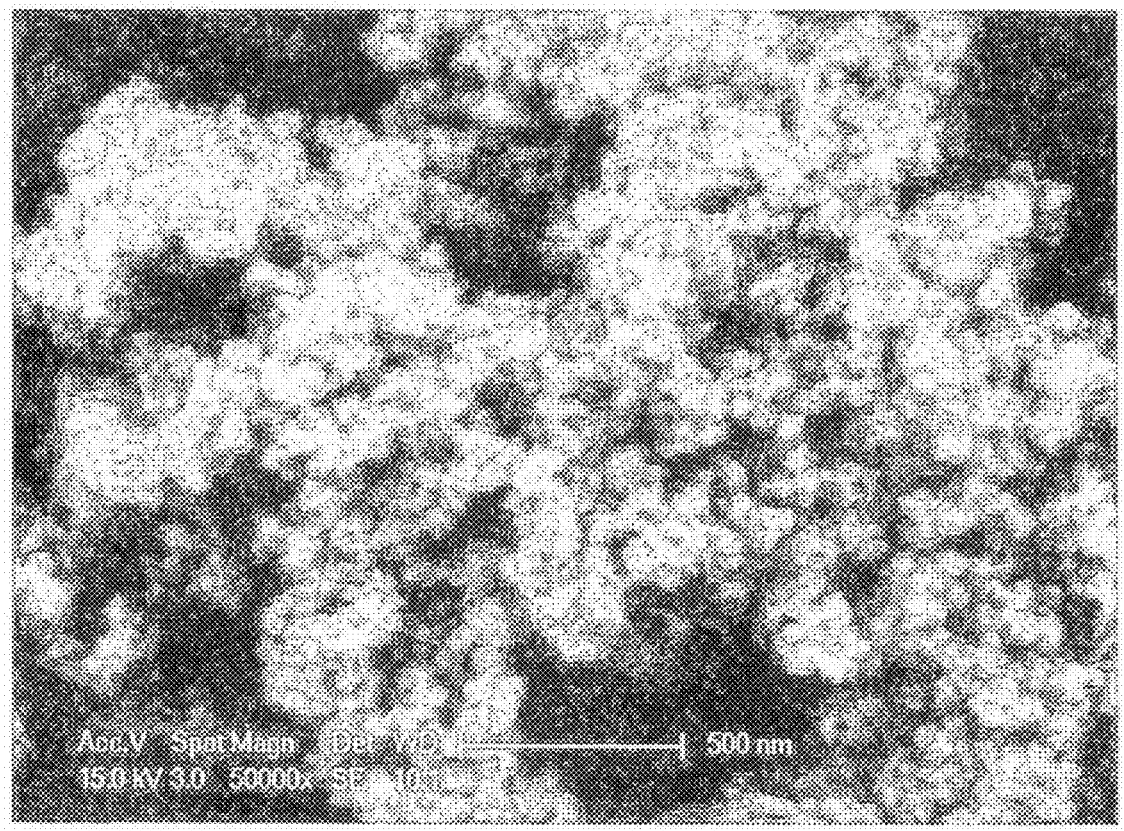
FIG. 8 is a scanning electron micrograph of Cu(In,Ga)Se$_2$ nanoparticles prepared according to Example 6.
Figure 9:
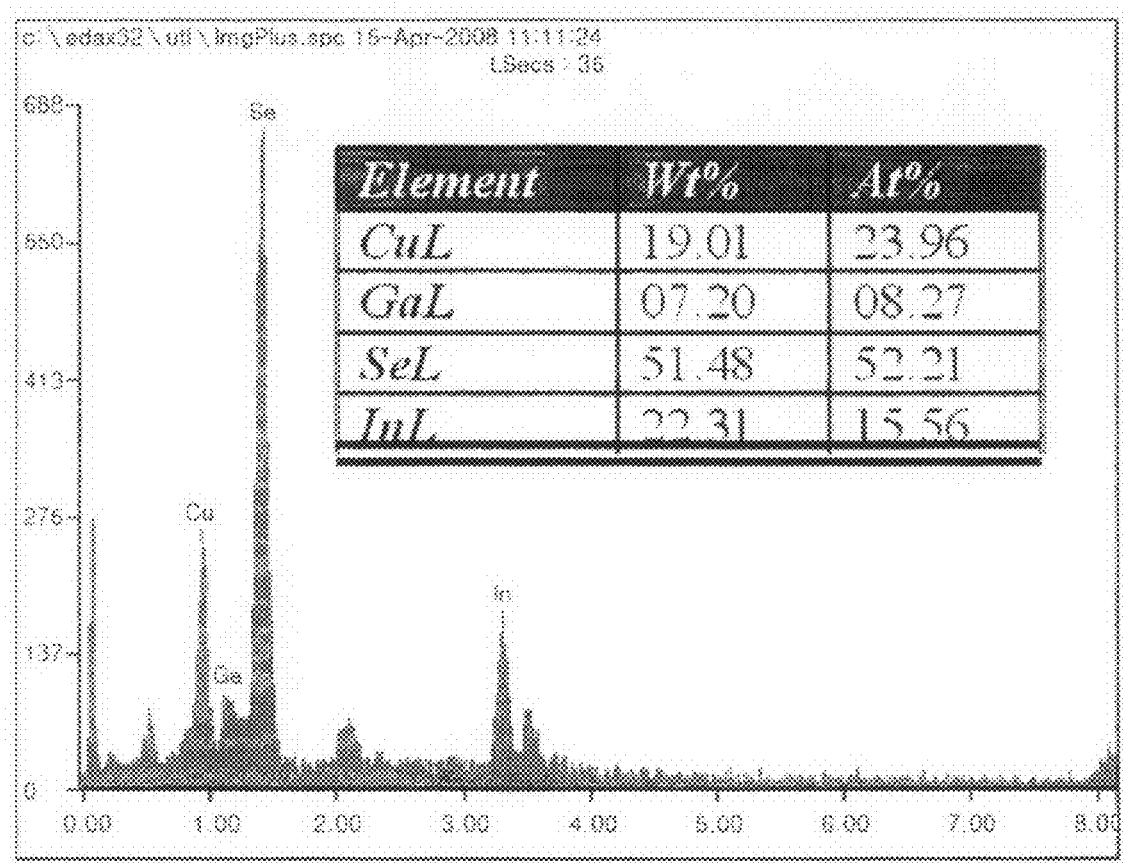
FIG. 9 is an EDS photo of Cu(In,Ga)Se$_2$ nanoparticles prepared according to Example 6.
Figure 10:
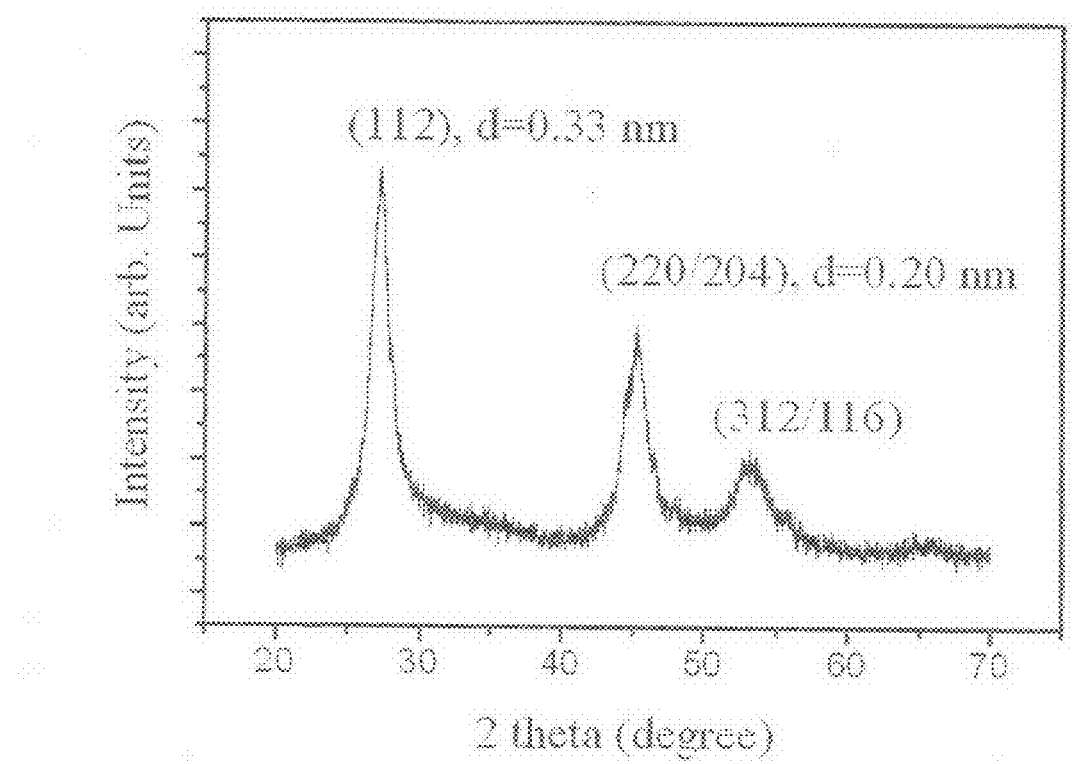
FIG. 10 is a graph of X-ray diffraction analysis of Cu(In,Ga)Se$_2$ nanoparticles prepared according to Example 6.

For qualitative analysis to find out the composition of thus obtained product, particle size distribution, and the phase determination of the final product, EDS, SEM and powder XRD analysis were carried out, disclosing the results in FIGS. 8, 9 and 10, respectively. The results show that the final product had the ratio of each element of Cu:In:Ga:Se being 0.96:0.62:0.33:2.09 and was comprised of agglomerated fine particles having a particle diameter of about 37 nm. The pattern of X-ray diffraction of the resulted product corresponded to the main peaks (112), (204)/(220) and (312)/(116) of CIGS in cubic phase.

Figure 11:
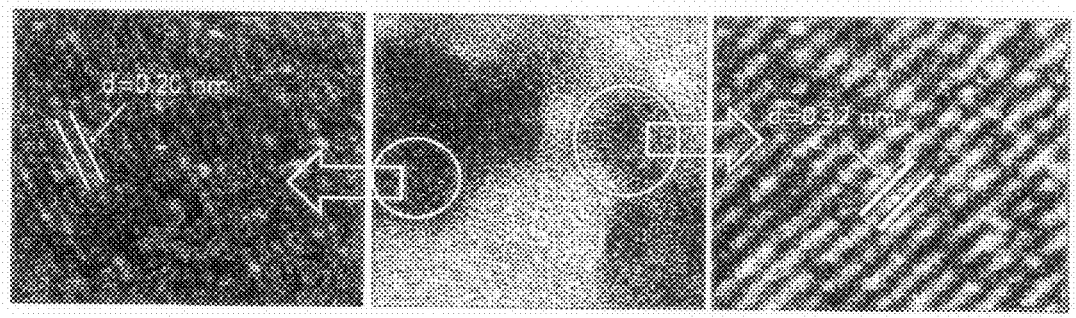
FIG. 11 is a transmission electron micrograph of Cu(In,Ga)Se$_2$ nanoparticles prepared according to Example 6.

FIG. 11 is a Transmission Electron Micrograph (TEM) of the resulted product. From the photo, the lattice spacing of the final product was measured as 0.20 nm and 0.32 nm. This result also agrees with (112) and (204/220) orientation of the X-ray diffraction pattern (FIG. 8) of the product.

Figure 12:
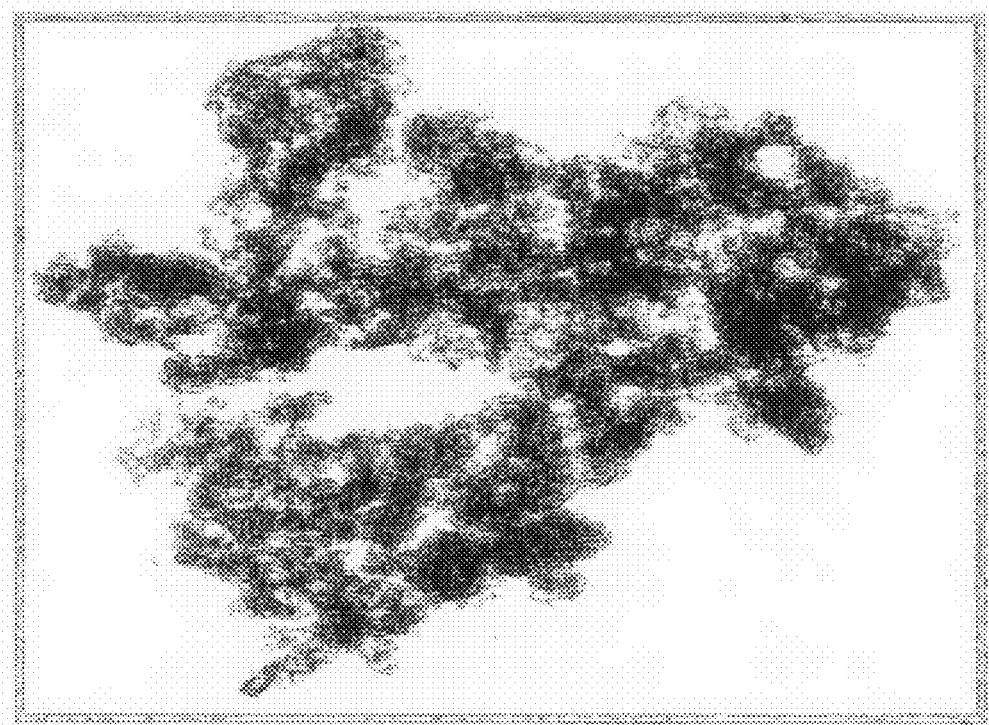
FIG. 12 is a photo of X-ray mapping of Cu, In, Ga and Se in Cu(In,Ga)Se$_2$ nanoparticles prepared according to Example 6.
Figure 12:
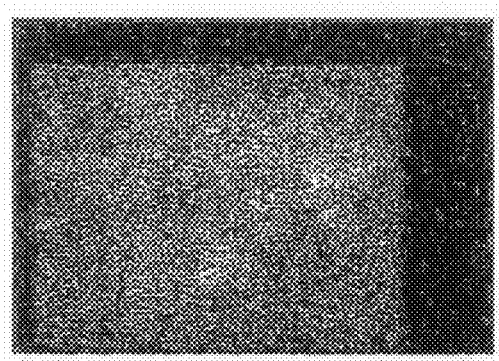
Figure 12:
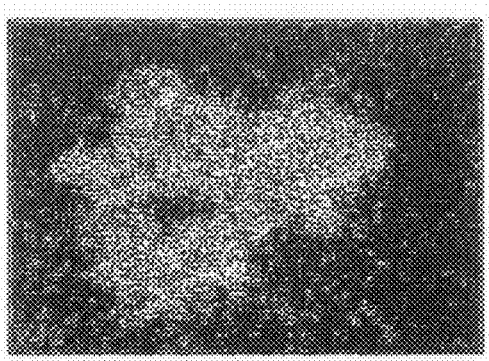
Figure 12:
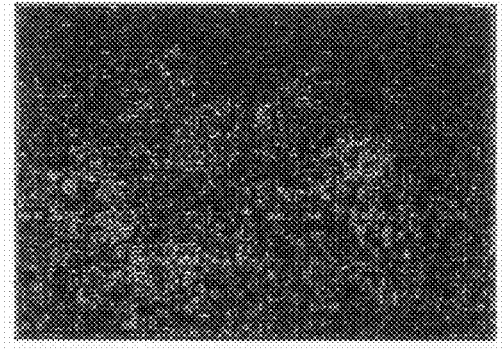
Figure 12:
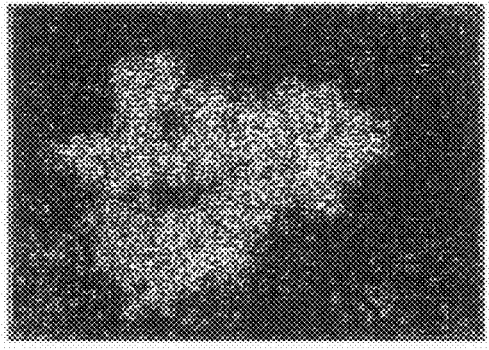

FIG. 12 is the result of X-ray mapping of each component of the resulted product, showing even distribution of each element Cu, In, Ga and Se. The result supports that the resulted product is formed of not a physical mixture of each element but CIGS compounds.

Example 7

Preparation of $CuInS_2$ Nanoparticles

A mixture of CuCl, $InCl_3$ and thioacetamide with the molar ratio of 1:1:2 was mixed with an alcoholic solvent. The mixed solution was ultrasonicated at 1000 for 4 hours and then dried in the air. The resulted product was centrifuged to remove the solvent, washed several times with distilled water and alcohol to remove by-products, and dried at 80° C. under the atmospheric pressure.

Figure 13:
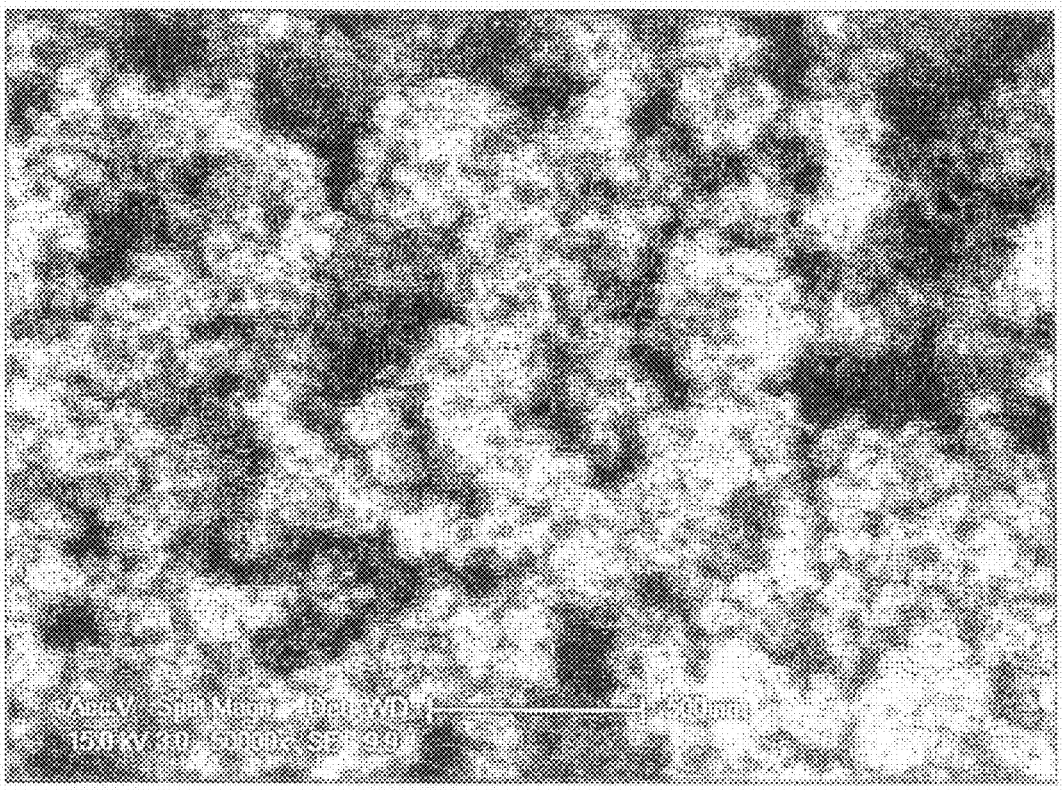
FIG. 13 is a scanning electron micrograph of CuInS$_2$ nanoparticles prepared according to Example 7.
Figure 14:
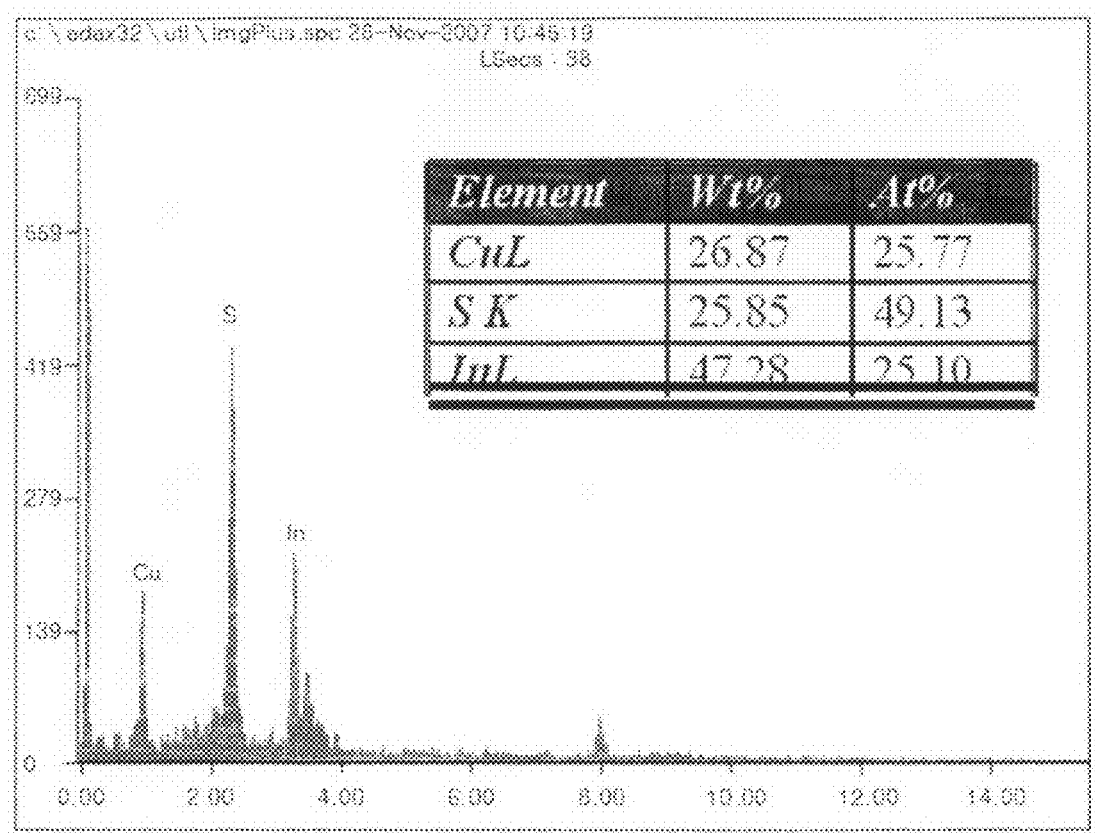
FIG. 14 is an EDS photo of CuInS$_2$ nanoparticles prepared according to Example 7.
Figure 15:
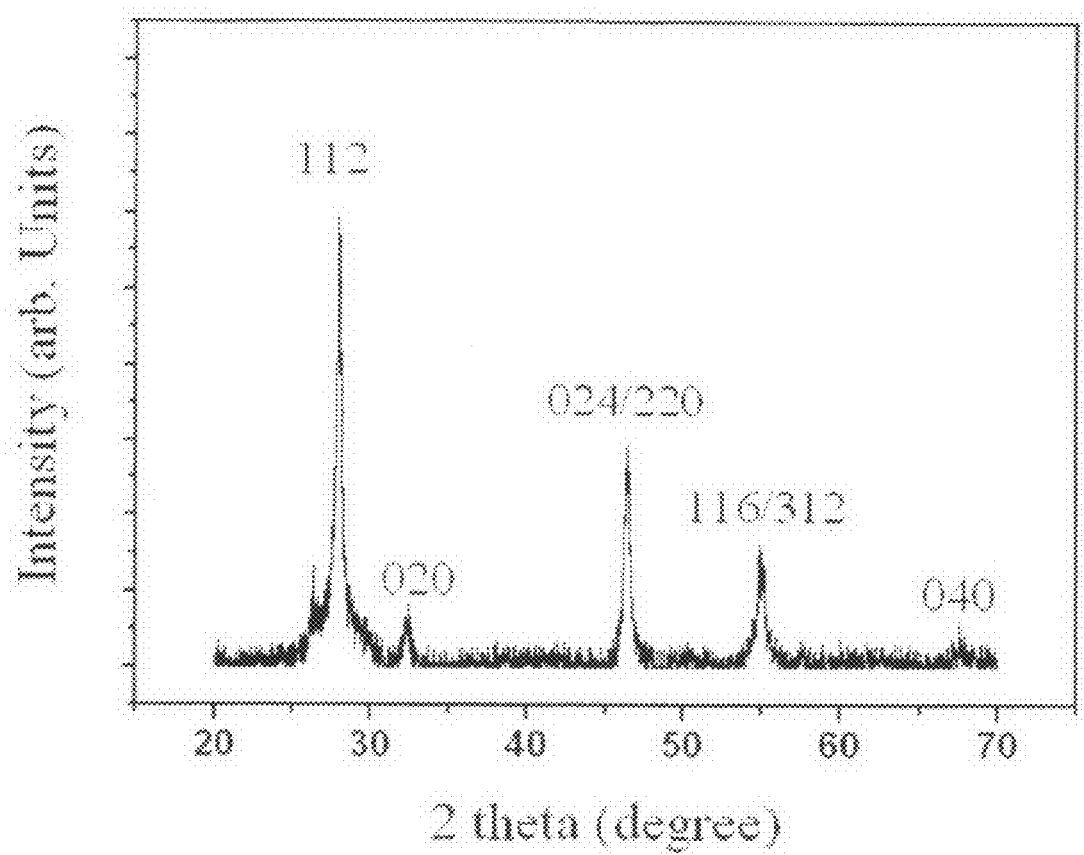
FIG. 15 is a graph of X-ray diffraction analysis of CuInS$_2$ nanoparticles prepared according to Example 7.
Figure 16:
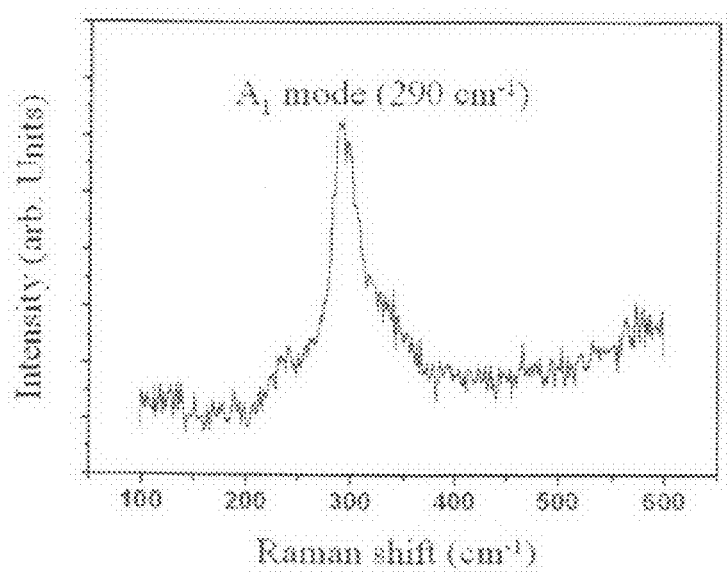
FIG. 16 is a graph of Raman analysis of CuInS$_2$ nanoparticles prepared according to Example 7.
Figure 17:
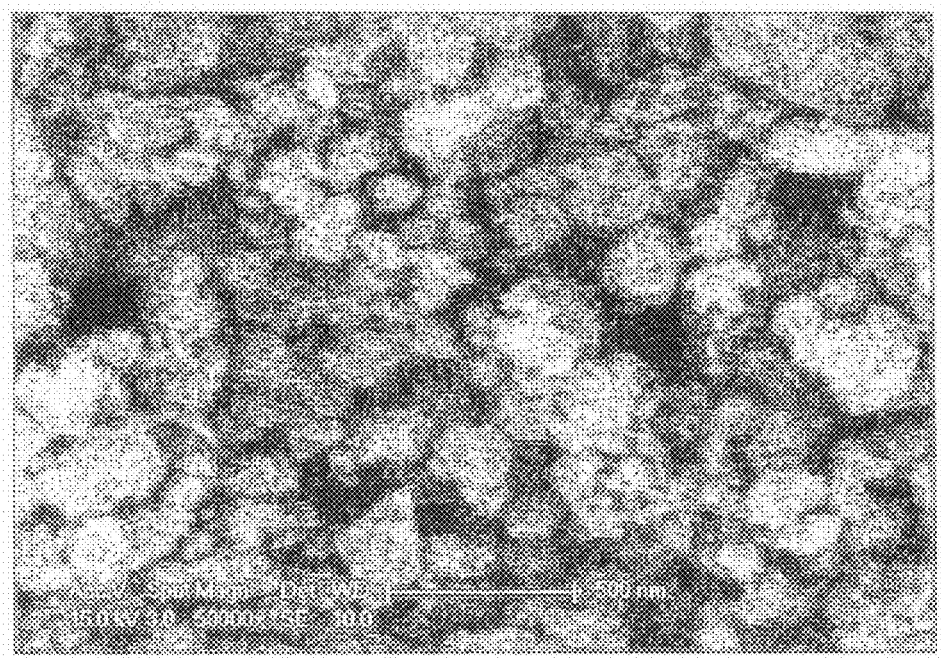
FIG. 17 is a scanning electron micrograph of Cu(In,Ga)S$_2$ nanoparticles prepared according to Example 8.
Figure 18:
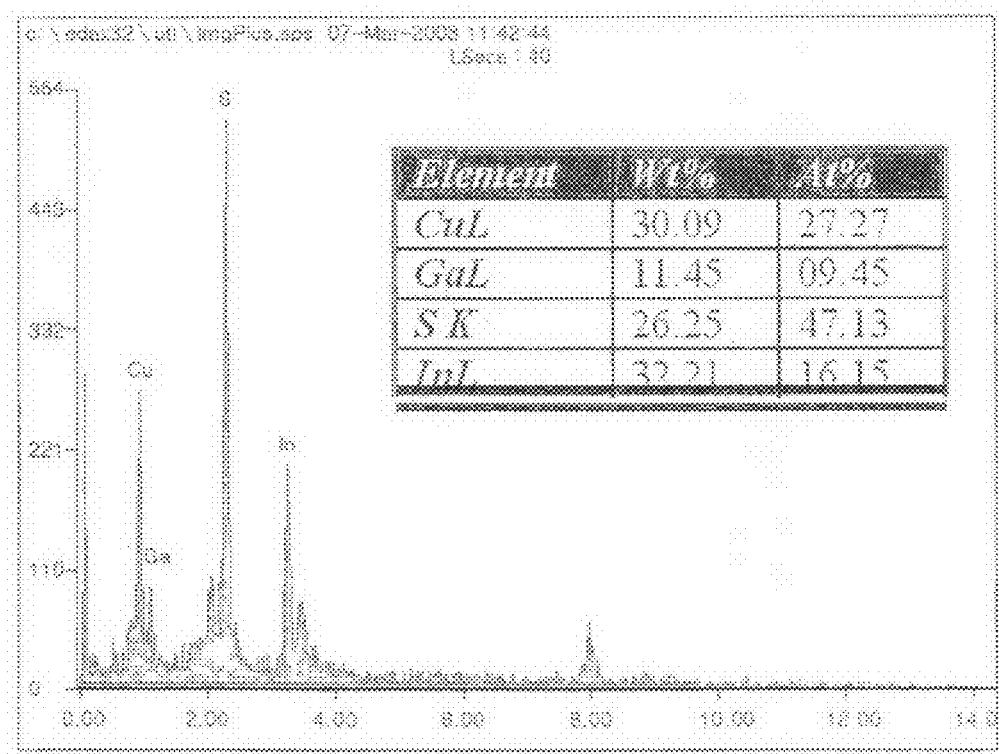
FIG. 18 is an EDS photo of Cu(In,Ga)S$_2$ nanoparticles prepared according to Example 8.
Figure 19:
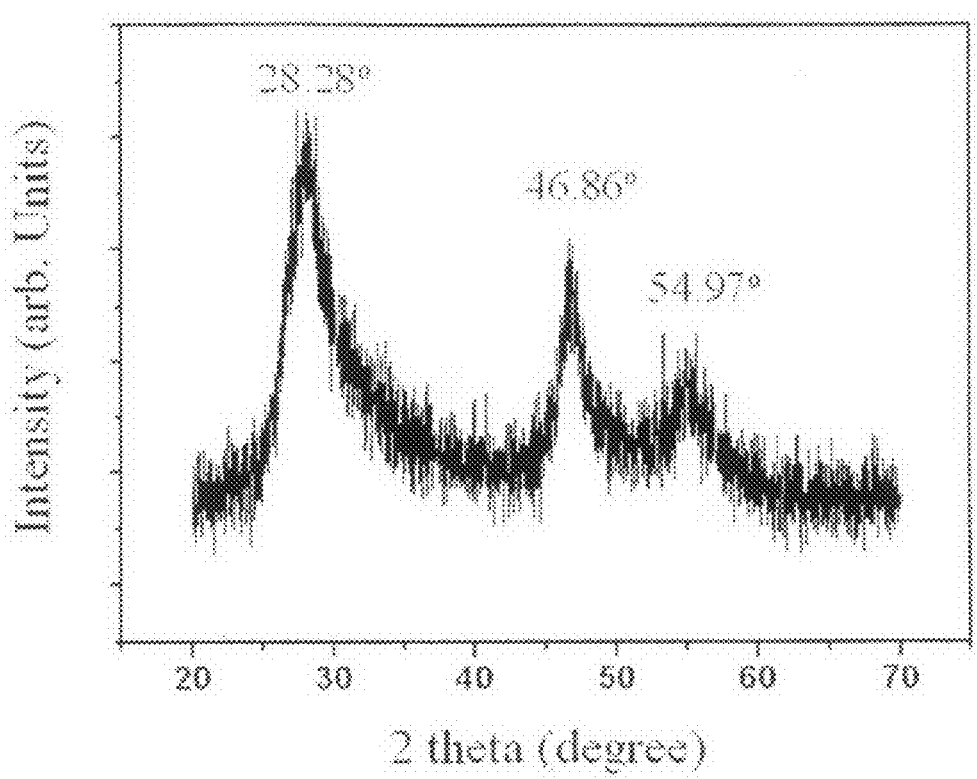
FIG. 19 is a graph of X-ray diffraction analysis of Cu(In,Ga)S$_2$ nanoparticles prepared according to Example 8.
Figure 20:
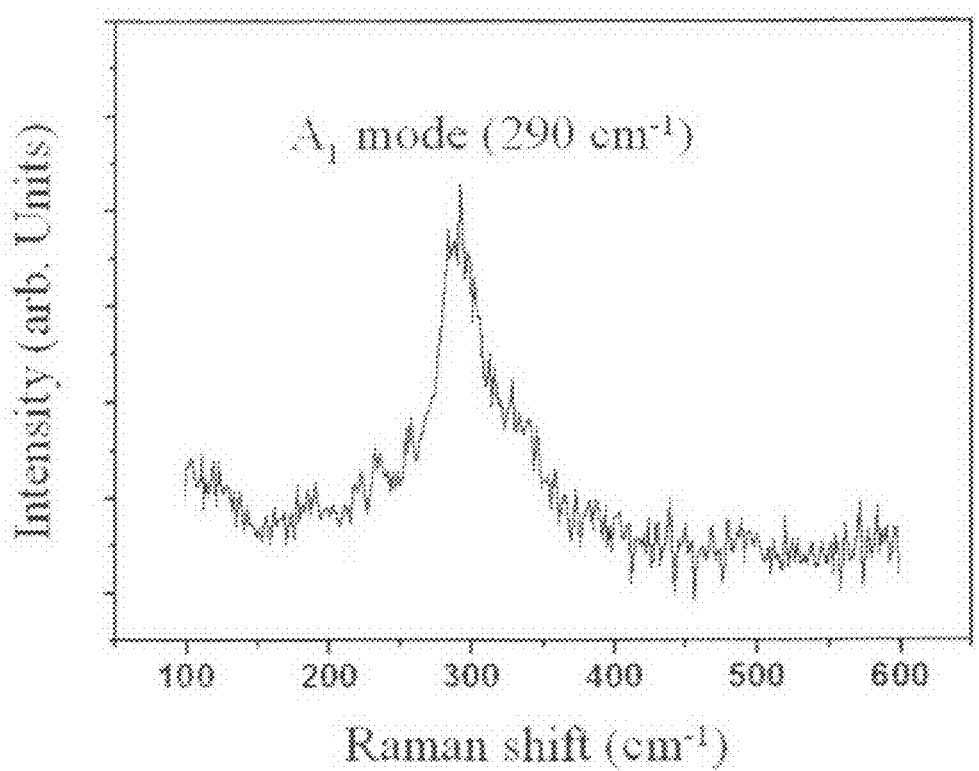
FIG. 20 is a graph of Raman spectroscopic analysis of Cu(In,Ga)S$_2$ nanoparticles prepared according to Example 8.

For qualitative analysis to find out the composition of thus obtained product and particle size distribution, characteristic transmission energy of each element was determined by using EDS and SEM, and the results were disclosed in FIGS. 13 and 14, respectively. The results show that the final product had the composition ratio of each element of Cu:In:S being 1.03:1.00:1.97 and was comprised of particles having a particle diameter of 27 nm~60 nm. In order to determine the phase of the obtained product, powder X-ray diffraction analysis and Raman spectroscopy were used, and the results were disclosed in FIGS. 15 and 16. As it can be seen from FIG. 15, in the vicinity of where 2 theta=27.9°, a peak (112) corresponding to $CuInS_2$ was observed. It can be also found that other major peaks corresponded to (020), (024)/(220), (116)/(312) and (040) orientation. FIG. 16 represents the results of Raman spectroscopy of the resulted product, showing a single peak at 290 cm$^{-1}$, which corresponds to $A_1$ mode of lattice vibration of $CuInS_2$ with a corresponding chemical equivalent ratio.

Example 8

Preparation of $Cu(In,Ga)S_2$ Nanoparticles

CuCl, $In(CH_3COO)_3$, Ga and Se powder were placed in a reactor with a molar ratio of 1:0.7:0.3:2, and mixed with an alcoholic solvent. The mixed solution was ultrasonicated at 100° C. for 4 hours and then dried in the air. The resulted product was centrifuged to remove the solvent, washed several times with distilled water and alcohol so as to remove by-products, and the dried at 80° C. under the atmospheric pressure.

For qualitative analysis to find out the composition of thus obtained product, particle size distribution, and the phase determination of the final product, EDS, SEM, powder X-ray diffraction analysis and Raman spectroscopy were performed, and the results were disclosed in FIGS. 17, 18, 19 and 20, respectively. The results of SEM and EDS show that the final product had the composition ratio of each element of Cu:In:Ga:S being 1.09:0.65:0.37:1.89 and was comprised of nanoparticles having a particle diameter of about 60 nm or less. In the result of Raman spectroscopy, a single peak was observed at 290 cm$^{-1}$. The result of X-ray diffraction analysis showed that the (112) peak of the final product had a diffraction angle higher than) $CuInS_2$ (27.94° obtained from Example 1. When a certain portion of Ga which is smaller than In is added to compounds such as $CuInS_2$ and $CuInSe_2$, peaks are generally observed at a higher diffraction angle. As a final product, $CuIn_{0.65}Ga_{0.35}S_2$ nanoparticles were synthesized.

Example 9

Fabrication of a Thin Film of Polycrystalline Light Absorber Layers

Figure 21:
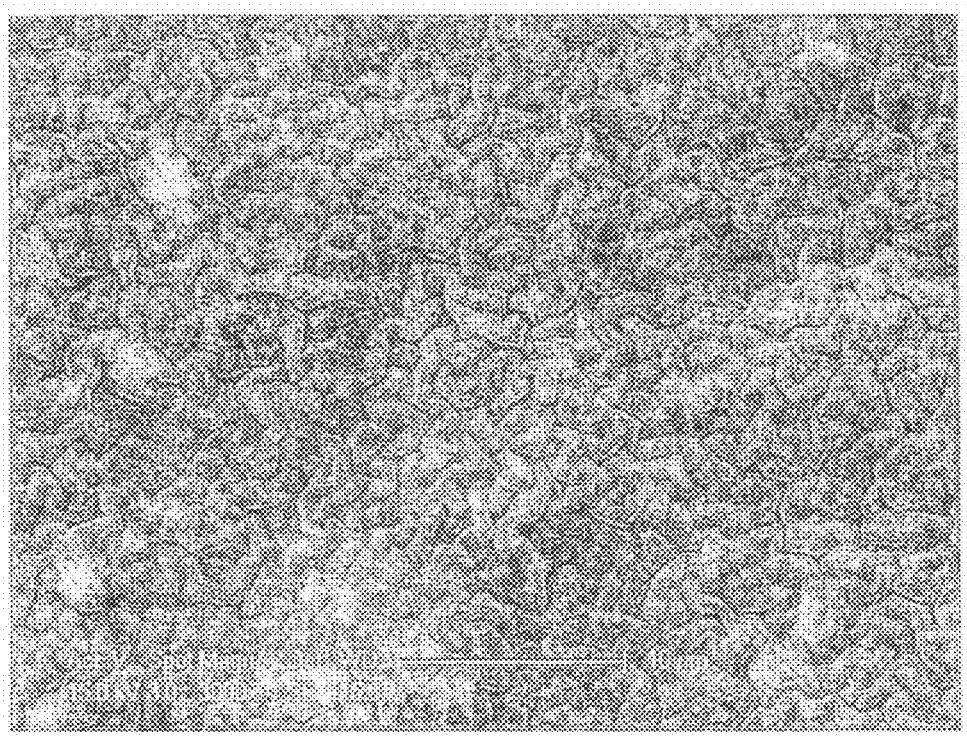
FIG. 21 is a front view of a scanning electron micrograph of a nanoparticle thin film according to Example 9, before heating.

In order to fabricate a polycrystalline CIS type thin film by heat treatment of a substrate on which nanoparticle precursors were deposited, the nanoparticles obtained from Examples 7 and 8 were first dispersed into a solvent such as water, alcohol or the like, and then deposited onto the substrate by using a doctorblade and spin casting methods. FIG. 21 is a SEM photo of a substrate where $CuInS_2$ nanoparticles were deposited by using a doctorblade. The thin film of nanoparticles was heated at a given temperature in Se vapor atmosphere, for a given time. The thin film of $CuInS_2$ nanoparticles was heated at 500° C. for 20 minutes, and the thin film of $CuIn_{0.65}Ga_{0.35}S_2$ nanoparticles at 450° C. for 15 minutes, and both of them were dried in the air.

Figure 22:
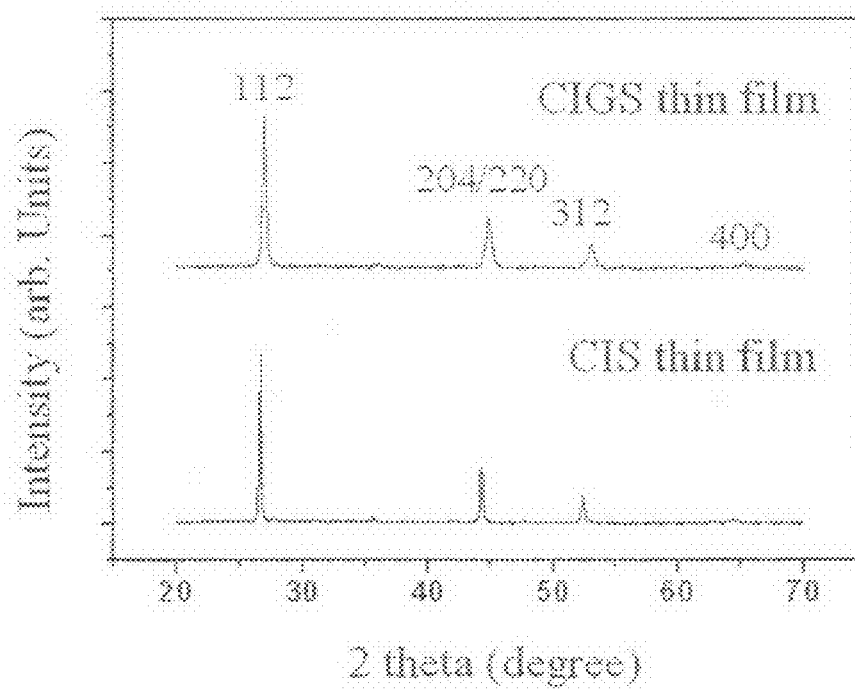
FIG. 22 is graphs of X-ray diffraction analysis of the thin films of each polycrystalline CuInSe$_2$ and Cu(In,Ga)Se$_2$ after heating process.

The result of X-ray diffraction analysis of the heated nanoparticle thin film was disclosed in FIG. 22. The thin film of $CuInS_2$ nanoparticles was treated with heat and then by using Se vapor, it was formed into a polycrystalline $CuInSe_2$ (CIS) thin film. When treating the thin film of $CuIn_{0.65}Ga_{0.35}S_2$ nanoparticles, the major peaks in X-ray diffraction analysis were observed at the diffraction angles of $CuIn_{0.7}Ga_{0.3}Se_2$ and $CuIn_{0.5}Ga_{0.5}Se_2$. Accordingly, it was confirmed that the thin film of $CuIn_{0.5}Ga_{0.35}S_2$ was converted to a thin film of polycrystalline $CuIn_{0.65}Ga_{0.35}Se_2$ (CIGS) by a Se vapor.

Figure 23:
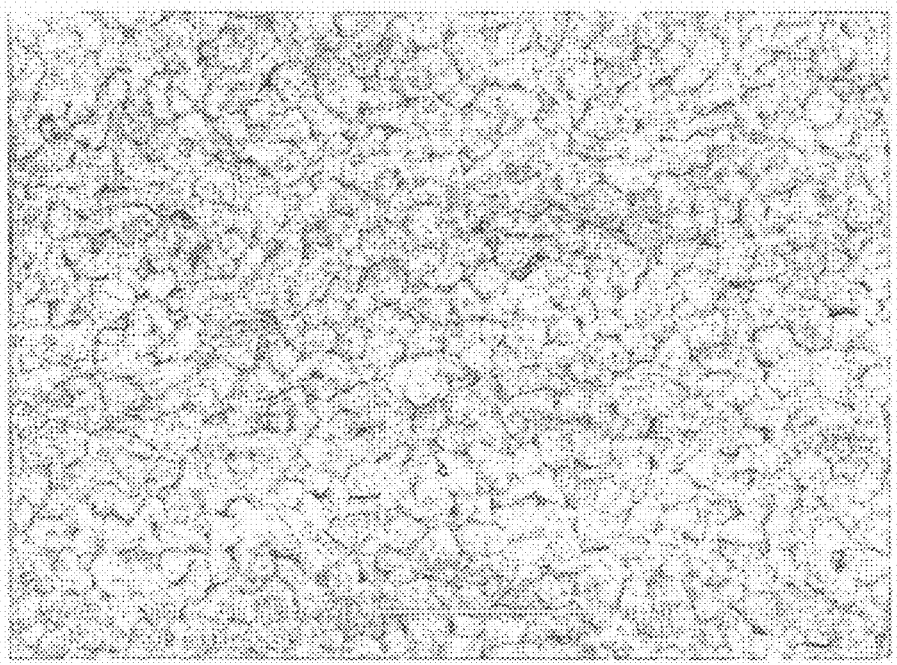
FIG. 23 is a top view of a scanning electron micrograph of a thin film of polycrystalline CuInSe$_2$.
Figure 24:
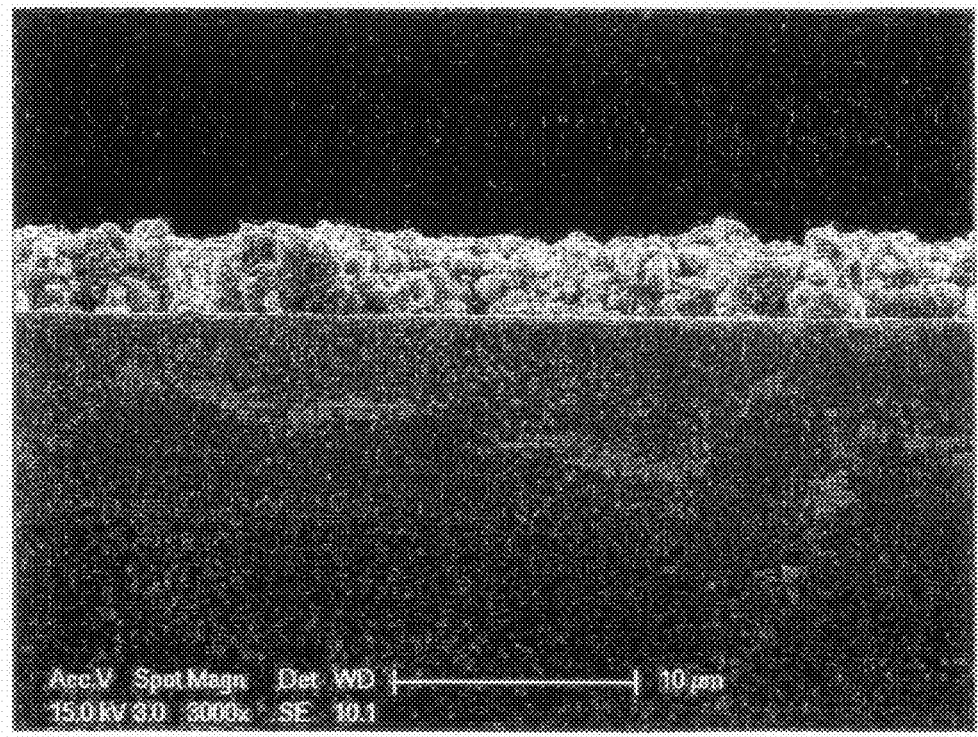
FIG. 24 is a cross-sectional view of a scanning electron micrograph of a thin film of polycrystalline CuInSe$_2$.

FIGS. 23 and 24 are a front and a side photo of SEM of a $CuInSe_2$ thin film which was fabricated by heat-treating the thin film of $CuInS_2$ nanoparticles prepared according to the present invention. It can be found that a thin film of polycrystalline $CuInSe_2$ having a thickness of about 3.0 μm and a particle size of 0.9 μm~2.0 μm was fabricated from a $CuInS_2$ nanoparticle thin film by heating and a Se vapor.

What is claimed is:

1. A method for preparing I-III-$VI_2$ nanoparticles, the method comprising the steps of:
   (a1) preparing a mixed solution by mixing each element from groups I, III and VI in the periodic table with a solvent, the solvent comprising N-chelants and water or alcoholic solvents;
   (a2) sonicating the mixed solution;
   (a3) separating the solvent from the sonicated mixed solution; and
   (a4) drying the product resulted from the step (a3) to obtain nanoparticles.

2. The method for preparing I-III-$VI_2$ nanoparticles according to claim 1, wherein the solvent further comprises ionic liquids.

3. The method for preparing I-III-$VI_2$ nanoparticles according to claim 2, wherein the ionic liquids comprise cationic compounds selected from the group consisting of alkyl amonium, N-alkyl pyridinium, N-alkyl pyridazinium, N-alkyl pyrimidinium, N-alkyl pyrazinium, N,N-alkyl imidazolium, N-alkyl pyrazolium, N-alkyl thiazolium, N-alkyl oxazolium, N-alkyl triazolium, N-alkyl phosphonium and N-alkyl pyrolidinium or derivatives thereof; and anions selected from the group consisting of hexafluoroantimonate ($SbF_6^-$), hexafluorophosphate (PF6-), tetrafluoroborate ($BF_4^-$), bis(trifluoromethylsulfonyl)amide (($CF_3SO_2)_2N$—), trifluoromethanesulfonate ($CF_3SO_3^-$), acetate ($OAc^-$) and nitrate ($NO_3^-$).

4. The method for preparing I-III-VI$_2$ nanoparticles according to claim 1, wherein the alcoholic solvents comprise one or two or more species selected from the group consisting of methanol, ethanol, propanol, isopropanol, butanol, isobutanol, 3-methyl-3-methoxy butanol, tridecyl alcohol, pentanol, ethylene glycol, propylene glycol, diethylene glycol, triethylene glycol, polyethylene glycol, dipropylene glycol, hexylene glycol, butylene glycol, sucrose, sorbitol and glycerin.

5. The method for preparing I-III-VI$_2$ nanoparticles according to claim 1, wherein the N-chelants comprise one or two or more species selected from the group consisting of amine compounds including diethyl amine, triethylamine, diethylene diamine, diethylene triamine, toluene diamine, m-phenylenediamine, diphenyl methane diamine, hexamethylene diamine, triethylene tetramine, tetraethylenepentamine, hexamethylene tetramine and 4,4-diaminodiphenyl methane, hydrazine, hydrazide, thioacetamide, urea and thiourea.

6. The method for preparing I-III-VI$_2$ nanoparticles according to claim 1, wherein the temperature of ultrasonication in the step (a2) is in the range of −13 to 200° C., and the ultrasonication in the step (a2) is carried out for 1 to 24 hours.

7. The method for preparing I-III-VI$_2$ nanoparticles according to claim 1, wherein:
the group I element is copper or copper compounds;
the group III element is indium or indium compounds, and gallium or gallium compounds;
the group VI element is selenium or selenium compounds, and sulfur or sulfur compounds, and
the I-III-VI$_2$ nanoparticles are Cu(In$_x$Ga$_{1-x}$)(Se$_y$S$_{1-y}$)$_2$ (0<x<1, 0<y<1) nanoparticles.

8. The method for preparing I-III-VI$_2$ nanoparticles according to claim 1, wherein:
the group I element is copper or copper compounds;
the group III element is indium or indium compounds, and gallium or gallium compounds;
the group VI element is selenium or selenium compounds, and
the I-III-VI$_2$ nanoparticles are CuIn$_x$Ga$_{1-x}$Se$_2$ (0<x<1) nanoparticles.

9. The method for preparing I-III-VI$_2$ nanoparticles according to claim 1, wherein:
the group I element is copper or copper compounds;
the group III element is indium or indium compounds, and gallium or gallium compounds;
the group VI element is sulfur or sulfur compounds, and
the I-III-VI$_2$ nanoparticles are CuIn$_x$Ga$_{1-x}$S$_2$ (0<x<1) nanoparticles.

10. The method for preparing I-III-VI$_2$ nanoparticles according to claim 1, wherein:
the group I element is copper or copper compounds;
the group III element is indium or indium compounds; and
the group VI element is selenium or selenium compounds and sulfur or sulfur compounds,
the I-III-VI$_2$ nanoparticles are CuIn(Se$_y$S$_{1-y}$)$_2$ (0<y<1) nanoparticles.

11. The method for preparing I-III-VI$_2$ nanoparticles according to claim 1, wherein:
the group I element is copper or copper compounds;
the group III element is gallium or gallium compounds;
the group VI element is selenium or selenium compounds and sulfur or sulfur compounds, and
the I-III-VI$_2$ nanoparticles are CuGa(Se$_y$S$_{1-y}$)$_2$ (0<y<1) nanoparticles.

12. The method for preparing I-III-VI$_2$ nanoparticles according to claim 1, wherein:
the group I element is copper or copper compounds;
the group III element is gallium or gallium compounds;
the group VI element is selenium or selenium compounds, and
the I-III-VI$_2$ nanoparticles are CuGaSe$_2$ nanoparticles.

13. The method for preparing I-III-VI$_2$ nanoparticles according to claim 1, wherein:
the group I element is copper or copper compounds;
the group III element is gallium or gallium compounds;
the group VI element is sulfur or sulfur compounds, and
the I-III-VI$_2$ nanoparticles are CuGaS$_2$ nanoparticles.

14. The method for preparing I-III-VI$_2$ nanoparticles according to claim 1, wherein:
the group I element is copper or copper compounds;
the group III element is indium or indium compounds;
the group VI element is selenium or selenium compounds, and
the I-III-VI$_2$ nanoparticles are CuInSe$_2$ nanoparticles.

15. The method for preparing I-III-VI$_2$ nanoparticles according to claim 1, wherein:
the group I element is copper or copper compounds;
the group III element is indium or indium compounds;
the group VI element is sulfur or sulfur compounds, and
the I-III-VI$_2$ nanoparticles are CuInS$_2$ nanoparticles.

16. The method for preparing I-III-VI$_2$ nanoparticles according to claim 1, wherein the group I element comprises one or two or more species selected from the group consisting of Cu, CuO, CuO$_2$, CuOH, Cu(OH)$_2$, Cu(CH$_3$COO), Cu(CH$_3$COO)$_2$, CuF$_2$, CuCl, CuCl$_2$, CuBr, CuBr$_2$, CuI, Cu(ClO$_4$)$_2$, Cu(NO$_3$)$_2$, CuSO$_4$, CuSe, Cu$_{2-x}$Se(0<x<2), Cu$_2$Se and hydrates thereof.

17. The method for preparing I-III-VI$_2$ nanoparticles according to claim 1, wherein the group III element comprises one or two or more species selected from the group consisting of n, In$_2$O$_3$, In(OH)$_3$, In(CH$_3$COO)$_3$, InF$_3$, InCl, InCl$_3$, ClInBr, InBr$_3$, InI, InI$_3$, In(ClO$_4$)$_3$, In(NO$_3$)$_3$, In$_2$(SO$_4$)$_3$, In$_2$Se$_3$, InGaSe$_3$, Ga, Ga$_2$O$_3$, Ga(OH)$_3$, Ga(CH$_3$COO)$_3$, GaF$_3$, GaCl, GaCl$_3$, GaBr, GaBr$_3$, GaI, GaI$_3$, Ga(ClO$_4$)$_3$, Ga(NO$_3$)$_3$, Ga$_2$(SO$_4$)$_3$, Ga$_2$Se$_3$, InGaSe$_3$ and hydrates thereof.

18. The method for preparing I-III-VI$_2$ nanoparticles according to claim 1, wherein the group VI element comprises one or two or more species selected from the group consisting of Se, H$_2$Se, Na$_2$Se, K$_2$Se, Ca$_2$Se, (CH$_3$)$_2$Se, CuSe, Cu$_{2-x}$Se(0<x<2), Cu$_2$Se, In$_2$Se$_3$, sulfur, thioacetamide, thiourea, thioacetic acid, alkyl thiol, sodium sulfide and hydrates thereof.

19. A method for fabricating a thin film of polycrystalline light absorber layers, the method comprising the steps of:
(S1) preparing I-III-VI$_2$ nanoparticles by using a nanoparticle preparation method according to any one of claim 1;
(S2) depositing the nanoparticles onto a substrate; and
(S3) heat-treating the nanoparticles deposited on the substrate in an atmosphere of Se, S, inert gas or gas mixture thereof, obtaining a thin film of polycrystalline I-III-VI$_2$.

* * * * *

UNITED STATES PATENT AND TRADEMARK OFFICE
CERTIFICATE OF CORRECTION

PATENT NO.         : 7,955,586 B2                                        Page 1 of 1
APPLICATION NO.    : 12/595330
DATED              : June 7, 2011
INVENTOR(S)        : Jung et al.

It is certified that error appears in the above-identified patent and that said Letters Patent is hereby corrected as shown below:

Column 12,
Line 39, delete "consisting of n" and insert --consisting of In--

Signed and Sealed this
Twenty-fourth Day of April, 2012

David J. Kappos
*Director of the United States Patent and Trademark Office*